(12) United States Patent
Ngo et al.

(10) Patent No.: US 9,957,062 B2
(45) Date of Patent: May 1, 2018

(54) FIRE-AND ELECTROMAGNETIC INTERFERENCE (EMI)-RESISTANT AIRCRAFT COMPONENTS AND METHODS FOR MANUFACTURING THE SAME

(71) Applicant: HONEYWELL INTERNATIONAL INC., Morristown, NJ (US)

(72) Inventors: Anh-Tuan Ngo, Phoenix, AZ (US); Brian G. Baughman, Surprise, AZ (US); Jim Balonis, Chandler, AZ (US); Donald G. Godfrey, Phoenix, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 955 days.

(21) Appl. No.: 14/081,009

(22) Filed: Nov. 15, 2013

(65) Prior Publication Data
US 2015/0367955 A1 Dec. 24, 2015

(51) Int. Cl.
| | | |
|---|---|---|
| *B64D 45/02* | (2006.01) | |
| *C23C 28/02* | (2006.01) | |
| *C23C 24/04* | (2006.01) | |
| *B64D 45/00* | (2006.01) | |

(52) U.S. Cl.
CPC .............. *B64D 45/02* (2013.01); *C23C 24/04* (2013.01); *C23C 28/021* (2013.01); *B64D 2045/009* (2013.01)

(58) Field of Classification Search
CPC .......... B29C 67/0051–67/0096; B29C 64/209; B29C 64/118; B33Y 10/00
See application file for complete search history.

(56) References Cited

U.S. PATENT DOCUMENTS

| | | | | |
|---|---|---|---|---|
| 3,352,742 A | * | 11/1967 | Mulec | B29C 70/00 156/221 |
| 5,429,326 A | * | 7/1995 | Garesche | B32B 3/10 156/157 |
| 6,505,089 B1 | * | 1/2003 | Yang | B29C 67/0055 264/308 |
| 7,402,277 B2 | | 7/2008 | Ayer et al. | |
| 8,389,126 B2 | | 3/2013 | Kusinski et al. | |
| 2009/0263582 A1 | * | 10/2009 | Batchelder | C22C 43/00 427/256 |
| 2010/0119707 A1 | * | 5/2010 | Raybould | C23C 24/04 427/185 |
| 2010/0239883 A1 | | 9/2010 | Okladek et al. | |

OTHER PUBLICATIONS

Project Outline TWI—CompoSurf Coating Technology for Increased Functionality of Composite Materials; PR18444, Jul. 2011; World Centre for Materials Joining Technology.
Harvey, D.: "TWI Surface Engineering Overview" TWI Ltd, 2013.

* cited by examiner

*Primary Examiner* — Alex A Rolland
(74) *Attorney, Agent, or Firm* — Lorenz & Kopf, LLP

(57) ABSTRACT

Fire- and electromagnetic interference (EMI)-resistant aircraft components and methods for manufacturing the same are provided. A thermally and electrically conductive coating material layer is formed on at least a portion of an intermediate article comprised of a non-metallic material. The thermally and electrically conductive coating material layer is comprised of a metal. A fire-retardant material layer is cold sprayed on the thermally and electrically conductive coating material layer. At least one continuous electrically conductive element may be integrated with the non-metallic material of the intermediate article.

11 Claims, 4 Drawing Sheets

FIRE- AND ELECTROMAGNETIC INTERFERENCE (EMI)-RESISTANT AIRCRAFT COMPONENTS AND METHODS FOR MANUFACTURING THE SAME

TECHNICAL FIELD

The present invention generally relates to aircraft components and their protection against certain hazards, and more particularly relates to fire- and electromagnetic interference (EMI)-resistant aircraft components and methods for manufacturing the same.

BACKGROUND

Aircraft components may be exposed to risks from certain hazards, such as fire and/or electromagnetic interference (EMI). For example, certain aircraft components may be used in an aircraft "fire zone", i.e., in an aircraft compartment that contains ignition sources and the potential for flammable fluid leakage. Some aircraft components may be equipped with electronic devices that can be harmed or disrupted by electromagnetic interference (EMI). Electromagnetic interference (EMI) is caused when electronic devices exhibit interference on other electronic equipment in their vicinity, causing negative consequences such as degradation or even malfunctioning. For example, EMI can lead to erased data, loss of connectivity for computers and cellphones, as well as more serious effects like the jamming of cockpit radios and radar signals that could ultimately hamper communication between an aircraft pilot and respective radio tower. A lightning storm is one source of EMI.

Conventional systems and methods for providing fire resistance to aircraft components include using thermal blankets and/or fire shields positioned around the component. Components can also be shielded to protect against EMI. Unfortunately, these blankets and shields add significant weight and space requirements. Where space is too limited, they cannot be used at all. Some aircraft components are designed with fire-retardant coatings, but these coatings can fail to protect a component from fire and do not offer any protection against EMI. This is especially true for non-metallic aircraft components.

Accordingly, it is desirable to provide fire- and EMI-resistant aircraft components and methods for manufacturing the same. In addition, it is also desirable to provide lightweight and effective integral and conformal fire- and EMI shielding materials for non-metallic aircraft components. Furthermore, other desirable features and characteristics of the fire- and EMI-resistant aircraft components and methods for manufacturing the same will become apparent from the subsequent detailed description and the appended claims, taken in conjunction with the accompanying drawings and the preceding background.

BRIEF SUMMARY

Methods are provided for manufacturing a fire- and electromagnetic interference (EMI)-resistant aircraft component. In accordance with one exemplary embodiment, a method for manufacturing a fire- and EMI-resistant aircraft component comprises forming a conductive coating material layer on at least a portion of an intermediate article comprised of a non-metallic material. The coating material layer is electrically and thermally conductive and comprised of metal. A fire-retardant material layer is cold-sprayed on the conductive coating material layer.

In accordance with another exemplary embodiment, a method for manufacturing a fire- and EMI-resistant aircraft component comprises forming an additive-manufactured intermediate article comprising a polymeric material. A thermally and electrically conductive coating material layer is applied on the additive-manufactured article forming a coated article. The thermally and electrically conductive coating material layer comprises a metal. A fire retardant material layer is cold sprayed on the coated article.

In accordance with another exemplary embodiment, a fire- and EMI-resistant aircraft component is provided. The fire- and EMI-resistant aircraft component comprises an article comprised of a polymeric material. A fire-retardant material layer overlies the article. A thermally and electrically conductive coating material layer is disposed intermediate the article and the fire-retardant material layer. Optionally, at least one continuous electrically conductive element is integrated with the polymeric material of the article.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
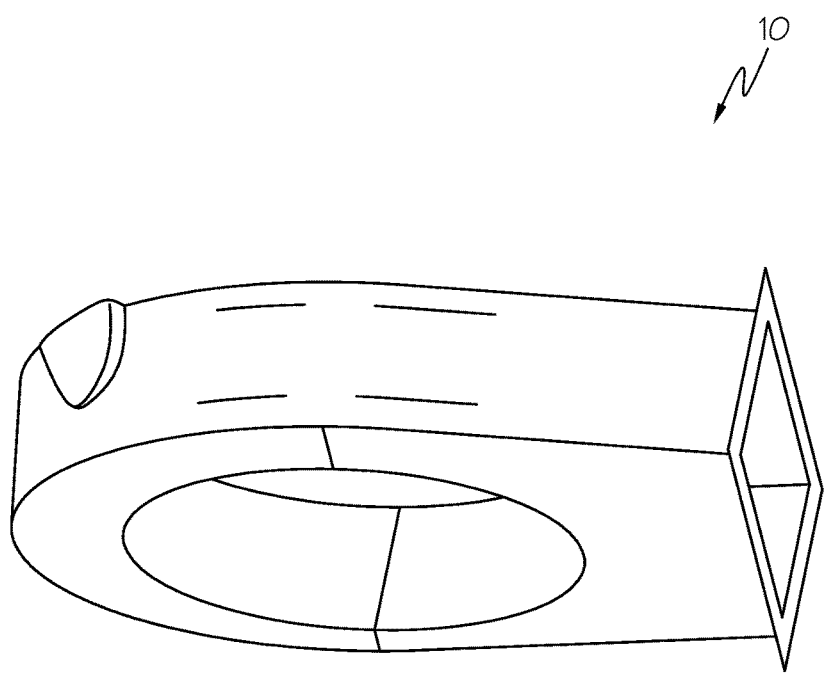
FIG. 1 is a cross-sectional view of a fire- and EMI-resistant inlet duct, an exemplary aircraft component manufactured by the methods according to exemplary embodiments.

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Various embodiments are directed to fire- and EMI-resistant aircraft components and methods for manufacturing the same. The definition of the terms "fire-resistant" or "fire-resistance" as used herein means the capacity to perform the intended functions under the heat and other conditions likely to occur when there is a fire at the place concerned. Aircraft components are demonstrated to be fire resistant by meeting the requirements of a flame exposure test. Therefore, the aircraft components manufactured by the methods according to exemplary embodiments meet the requirements for the flame exposure test and are therefore deemed "fire-resistant." The flame exposure test requires that the aircraft component has the ability to withstand a 15 minute kerosene burner test. The term "aircraft components" as used herein includes gas turbine engine components and other components located within an aircraft, at least a portion thereof requiring fire-resistance (i.e., a component that needs to pass the flame exposure test to be put into usage), EMI resistance (i.e., a component equipped with an electronic device that can be harmed or disrupted by EMI), or both fire- and EMI-resistance. The term "aircraft components" includes, for example, mounts, cases, brackets, ducts, inlets, sheet or structural members, fluid-carrying lines (e.g., piping), fluid system parts, wiring, fittings, and powerplant controls. Aircraft interiors and structures can also be made fire- and EMI-resistant. As used herein, a "fire- and EMI-resistant aircraft component" means that that the entire component or at least a portion thereof, is fire- and EMI-resistant.

As noted previously, the aircraft component may be used inside or outside of an aircraft fire zone, i.e., an aircraft compartment that contains ignition sources and the potential for flammable fluid leakage. Such compartments are classified as "fire zones." For example, the engine case around the compressor, combustor, and turbine sections of the engine define a fire zone. The gearbox and its accessories are also considered potential ignition sources during failure conditions that could cause temperatures to exceed the auto ignition temperatures of fluids that may be present in the compartment. The APU compartment is by definition a fire zone. There are other fire zones aboard an aircraft. In accordance with exemplary embodiments, imparting fire-resistance also imparts electromagnetic interference (EMI) resistance.

Figure 3:
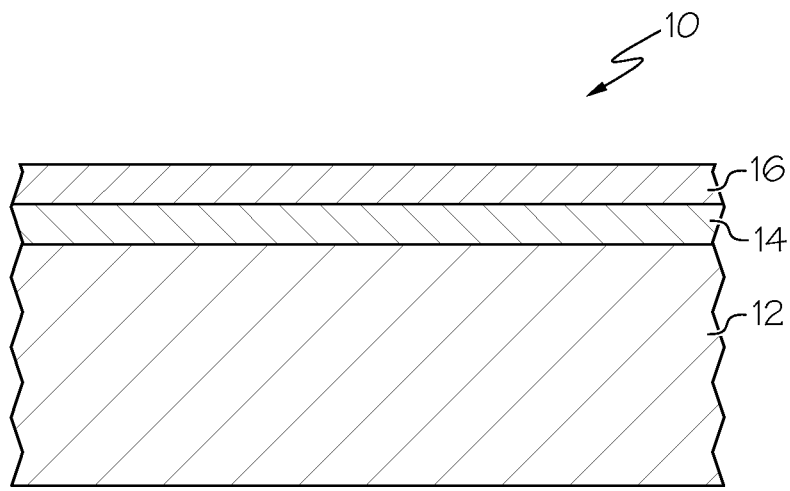
FIG. 3 is a cross sectional view of a portion of a fire- and EMI-resistant aircraft component, such as the inlet duct of FIG. 1.

Referring to FIGS. 1 and 3, according to exemplary embodiments, the fire- and EMI-resistant aircraft component 10 comprises an intermediate article 12 and a fire-retardant layer 16 with a thermally and electrically conductive coating material layer 14 between the intermediate article and the fire-retardant layer. This type of coating system is called a "sandwich" coating system because the thermally and electrically conductive coating material layer is bound between two structures—the intermediate article 12 and the fire-retardant material layer 16. The sandwich coating system is used here because—the fire-retardant layer (also known as a "thermally resistant layer") must be on the outside surface for maximum protection.

Figure 2:
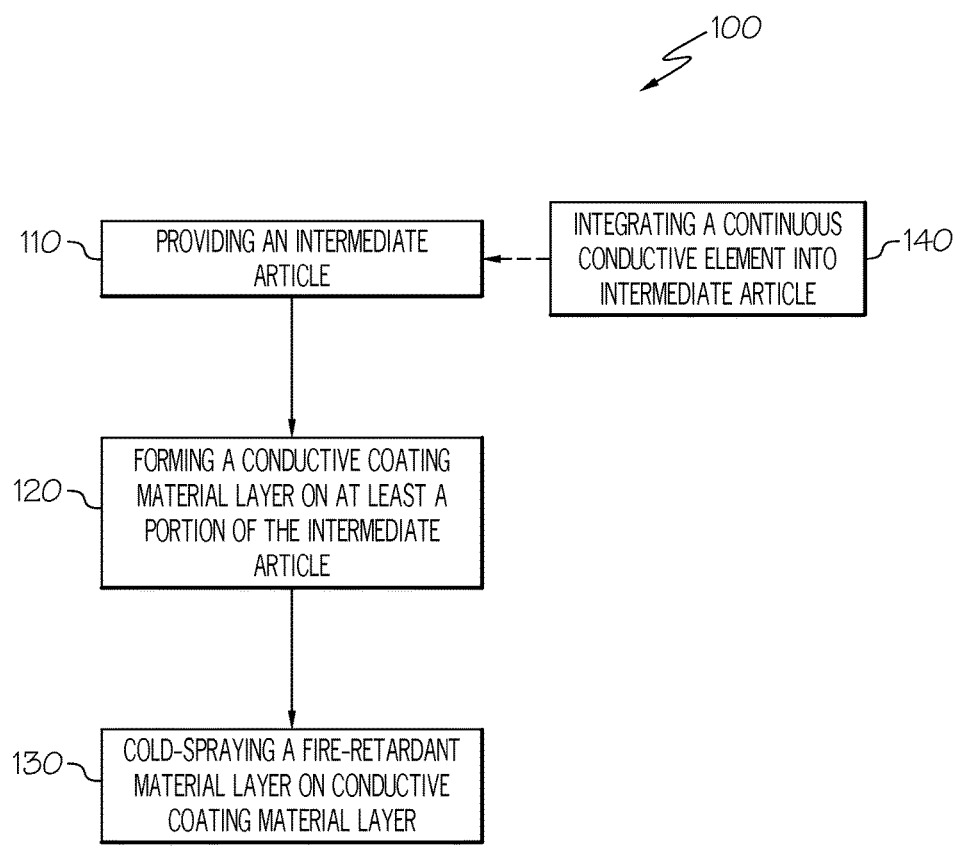
FIG. 2 is a flow diagram of a method for manufacturing fire- and EMI-resistant aircraft components, according to exemplary embodiments of the present invention.

Referring now to FIG. 2, in accordance with exemplary embodiments, a method 100 for manufacturing a fire- and EMI-resistant aircraft component, such as the inlet duct of FIG. 1 (identified as an exemplary fire- and EMI-resistant aircraft component 10), begins by providing the intermediate article 12 (step 110). The intermediate article 12 comprises a non-metallic material of polymer or composite construction. Suitable exemplary polymers (polymer materials) include natural and synthetic rubber, polymer resins, polyimides, polyether ether ketones (PEEK), cyanate esters, bismaleimids (BMI), neoprenes, nylons, polyvinyl chlorides (PVC or vinyl), polystyrenes, polyethylenes, polypropylenes, polyacrylonitriles, polyvinyl butyrals (PVB), silicones, and many more.

"Composite materials" are defined as materials made from two or more constituent materials with significantly different physical or chemical properties, that when combined, produce a material with characteristics different from the individual components. The individual components remain separate and distinct within the finished structure. Suitable exemplary engineered composite materials include composite building materials such as cements, concrete, reinforced plastics such as fiber-reinforced polymers, metal composites, and ceramic composites (composite ceramic and metal matrices). Suitable exemplary fibers used to reinforce the polymers in the fiber-reinforced construction include carbon fibers (e.g., IM7, AS4, T300, etc.), fiber glass, Kevlar, and many more. The non-metallic material comprises a non-fire-resistant material (i.e., the non-metallic material does not pass the flame exposure test).

In one embodiment, the intermediate article 12 may be already available and obtainable from commercial sources. For example, the intermediate article may comprise an already manufactured component that fails to pass the flame certification test (i.e., the already manufactured component is non-compliant with the flame certification test and is therefore not fire-resistant). For example, the intermediate article 12 may be part of old stock and rather than scrapping the non-compliant component, a fire- and EMI-resistant component 10 may be manufactured from the non-compliant component (here, the intermediate article) by performing the forming and cold spraying steps 120 and 130 as hereinafter described.

In an alternative embodiment, the fire- and EMI-resistant component 10 may be manufactured from an intermediate article 12 formed by any suitable manufacturing process. For example, the intermediate article comprising the polymeric material may be formed by a known additive manufacturing process. The polymeric material (a "build material") may be used in an additive-manufacturing process as known in the art to form the intermediate article 12 from which the fire- and EMI-resistant component 10 is manufactured. Additive Manufacturing (AM) is defined by the American Society for Testing and Materials (ASTM) as the "process of joining materials to make objects from 3D model data, usually deposit layer upon deposit layer, as opposed to subtractive manufacturing methodologies, such as traditional machining and casting." Some examples of additive manufacturing processes include: micro-pen deposition in which liquid media is dispensed with precision at the pen tip and then cured; selective laser sintering in which a laser is used to sinter a powder media in precisely controlled locations; laser wire deposition in which a wire feedstock is melted by a laser and then deposited and solidified in precise locations to build the product; electron beam melting; laser engineered net shaping; and direct metal deposition. In general, additive manufacturing processes provide flexibility in free-form fabrication without geometric constraints, fast material processing time, and innovative joining techniques. A finishing step may be performed on the intermediate article formed by the additive-manufacturing process. The finishing step may include, for example, machining, etc. as long as the article is not exposed to heat. In some embodiments, the finishing step may be unnecessary and may be omitted.

In an additive-manufacturing process, a model, such as a design model, of the component may be defined in any suitable manner. For example, the model may be designed with computer aided design (CAD) software. The model may include 3D numeric coordinates of the entire configuration of the component including both external and internal surfaces of an airfoil, platform and dovetail. The model may include a number of successive 2D cross-sectional slices that together form the 3D component. Sequential deposit layers of build material (in this case, polymeric material) are fused and solidified according to the three-dimensional (3D) model. Each successive deposit layer of the intermediate article may be, for example, between about 10 μm and about 200 μm, although the thickness may be selected based on any number of parameters.

Figure 5:
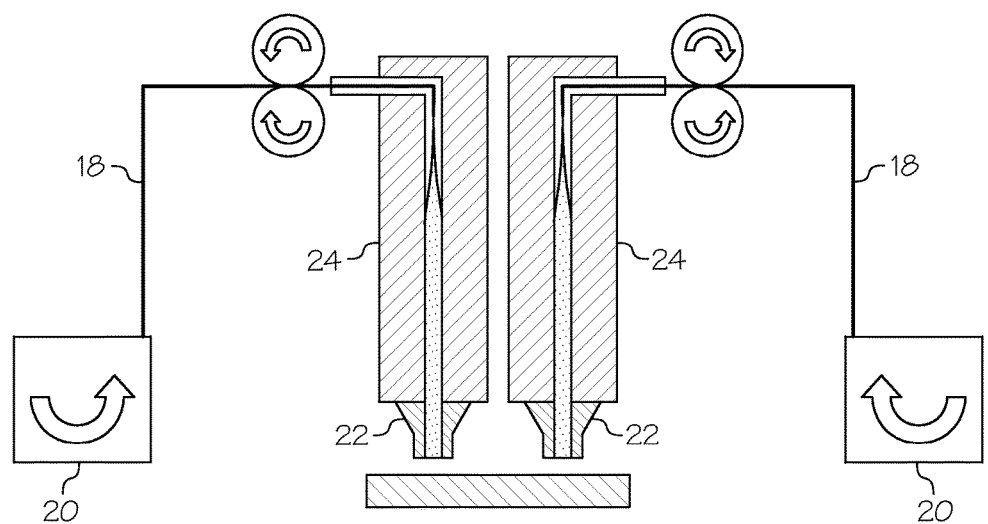
FIG. 5 is a schematic diagram of a conventional FDM additive manufacturing process.

In one exemplary embodiment, fused deposition modeling (FDM) may be used to form the additive-manufactured intermediate article comprised of the polymeric material. A schematic of a FDM process is depicted in FIG. 5. FDM is an additive manufacturing process that works on an "additive" principle by laying down material in layers; here, the polymeric filament 18 is unwound from a coil 20 (the "material cartridge in FIG. 5) and is supplied through an extrusion nozzle 22 to form the intermediate article. The FDM process begins with a software process which processes an STL file (stereolithography file format), mathematically slicing and orienting the 3-D model for the build process. The polymeric material is heated (by heater block 24 in FIG. 5) past its glass transition temperature and the molten polymeric material is then deposited by an extrusion head, which follows a tool-path defined by computer-aided manufacturing (CAM) software, and the intermediate article 12 is built from the bottom up, one layer at a time. The filament of the polymeric material is unwound from the coil and supplied to the extrusion nozzle which can turn the flow on and off. The nozzle is heated to melt the polymeric material and can be moved in both horizontal and vertical directions by a numerically controlled mechanism, directly controlled by the computer-aided manufacturing (CAM) software. The intermediate article is formed by extruding small beads of the polymeric material to form layers as the material hardens immediately after extrusion from the nozzle. Stepper motors or servo motors are typically employed to move the extrusion head that includes the extrusion nozzle.

Although the FDM additive manufacturing process is described herein for forming the intermediate article comprising a polymeric material, other additive manufacturing processes and other manufacturing processes in general may be employed to form the intermediate article comprising the polymeric material. The intermediate article comprising the composite material may be formed by conventional composite manufacturing processes (e.g., using composite ply lay-ups).

Figure 4:
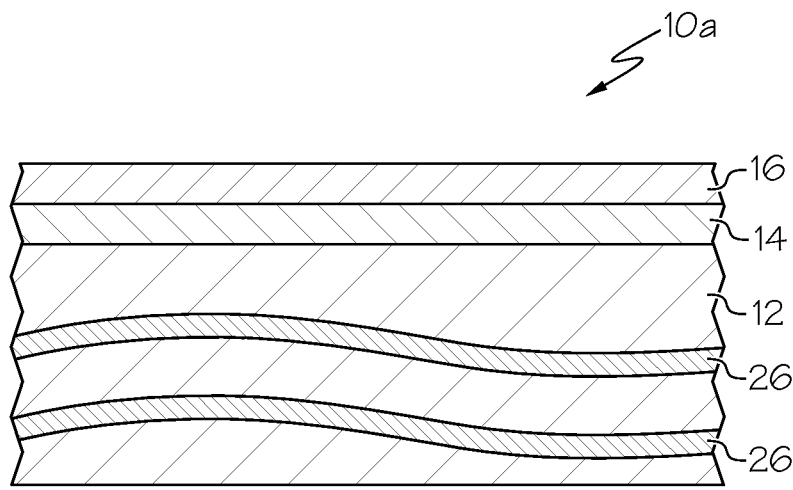
FIG. 4 is a cross sectional view of a portion of a fire- and EMI-resistant aircraft component, according to another exemplary embodiment of the present invention.

Still referring to FIG. 2 and now to FIG. 4, in an embodiment, the step of providing the intermediate article further comprises optionally integrating a continuous electrically conductive element 26 into the substrate of the intermediate article to be formed (step 140). Thus, the intermediate article 12 and the fire- and EMI-resistant aircraft component 10a to be manufactured therefrom may further comprise the continuous electrically conductive element 26. The material for the continuous electrically conductive element comprises copper, aluminum, and their alloys, as well as combinations thereof. The term "continuous electrically conductive element" as used herein refers to a thin, continuous elongate electrically conductive element generally and more particularly, comprises an electrically conductive wire which may be of any cross-sectional shape such as circular, triangular, square, rectangular or polygonal or a like continuous element in the form of an electrically conductive tape, ribbon, or the like. The continuous electrically conductive element has an electrical resistivity of less than about 2.75 ohm/m at room temperature (70° Fahrenheit). The continuous electrically conductive element may be in a spiral form to add strength to the polymeric material or composite material in the vertical (Z) direction. The continuous electrically conductive element provides EMI-resistance to the fire- and EMI-resistant component 10a to be manufactured. In addition to providing EMI-resistance, the continuous electrically conductive element 26 also provides a conduction path through the fire- and EMI-resistant aircraft component 10a, thereby permitting transmission of a signal (e.g., a radio signal) from one end of the component to the other end of the component.

The continuous electrically conductive element 26 may be integrated into the intermediate article 12 to be formed by integration with the non-metallic material of the intermediate article to be formed. For example, when forming the intermediate article comprised of the polymeric material by the FDM additive manufacturing process, the extrusion nozzle 22 (FIG. 5) incorporates a twin-arc or dual-arc welding system with dual extrusion heads for simultaneously feeding the polymeric material filament 18 and the continuous electrically conductive element 26, i.e., in this example, the extrusion head may include more than one nozzle to extrude the polymeric component material to build the intermediate article and another nozzle to feed the continuous electrically conductive element through the intermediate article as it is being built. The continuous electrically conductive element extends from one end of the intermediate article to the other end of the intermediate article.

The continuous electrically conductive element 26 may be integrated into the intermediate article 12 comprising the polymeric material formed by manufacturing processes other than by the FDM additive manufacturing process. The continuous electrically conductive element 26 may also be integrated into the composite plies when forming a composite ply lay-up (not shown). As noted previously, the continuous electrically conductive element provides EMI-resistance and a conductive path to the fire- and EMI-resistant component 10a to be manufactured. Additionally, the tensile strength of the fire- and EMI-resistant component 10a to be manufactured with the continuous electrically conductive element 26 is improved relative to the tensile strength of the fire and EMI-resistant component 10 that does not comprise the continuous electrically conductive element.

Referring again to FIGS. 2 through 4, in accordance with exemplary embodiments, the method 100 for manufacturing a fire- and EMI-resistant component continues by forming a layer 302 of conductive coating material (hereinafter "a thermally and electrically conductive coating material layer") on at least a portion of the intermediate article forming a coated article (step 120). The thermally and electrically conductive coating material layer has a thermal conductivity of greater than 175 W/m-K (watts/meters-Kelvin) at room temperature (70° F.) and an electrical resistivity of less than about 2.75 ohm/m at room temperature. The thermally and electrically conductive coating material layer may be applied locally ("at least a portion") or over the entire intermediate article 12. The thermally and electrically conductive coating material layer is applied only where fire resistance is needed to avoid adding unnecessary weight. The thermally and electrically conductive coating material layer 14 is comprised of a pure metal or metal alloy. Suitable exemplary materials for the thermally and electrically conductive coating material layer include copper, aluminum, combinations thereof, their alloys, and brass. The thickness of the thermally and electrically conductive coating layer may be from about 10 μm to about 200 μm. The conductive coating material may be applied by cold-spraying techniques. Such techniques are well known in the art. The coating material may alternatively be applied by any known coating techniques such as, for example, chemical vapor deposition, plating, or the like. As the thermal conductivity of the conductive coating material is high (greater than 175 W/m-K), the thermally and electrically conductive coating material layer acts to transfer heat away from the fire- and EMI-aircraft component. The thermally and electrically conductive coating material layer also provides EMI resistance to the fire- and EMI-resistant component.

Still referring to FIGS. 2 through 4, in accordance with exemplary embodiments, the method 100 for manufacturing a fire- and EMI-resistant aircraft component continues by thereafter cold spraying the fire-retardant coating 16 on the thermally and electrically conductive coating material layer on the intermediate article (step 130). The fire-retardant coating 16 may be applied by known cold-spraying techniques to a thickness of about 100 μm to about 700 μm. It is preferred for the coating to be as thin as possible because of weight concerns but still provide fire-resistance. The preferred density of the fire-retardant coating is about 98 to about 100 percent. The fire-retardant coating comprises a fire-retardant material. Exemplary fire-retardant materials include nickel-based alloys and superalloys such as INCONEL® alloys, ferrous-based alloys (e.g., stainless steel), cobalt-based alloys, and combinations thereof. Stainless steel is a ferrous-based alloy with a minimum of 10.5% chromium content by mass. The compositions of the INCONEL alloys are different but all are predominantly nickel, with chromium as the second element as shown below:

| Inconel | Ni | Cr | Fe | Mo | Nb | Co | Mn | Cu | Al | Ti | Si | C | S | P | B |
|---|---|---|---|---|---|---|---|---|---|---|---|---|---|---|---|
| 600 | 72.0 | 14.0-17.0 | 6.0-10.0 | | | | 1.0 | 0.5 | | | 0.5 | 0.15 | 0.015 | | |
| 617 | 44.2-56.0 | 20.0-24.0 | 3.0 | 8.0-10.0 | | 10.0-15.0 | 0.5 | 0.5 | 0.8-1.5 | 0.6 | 0.5 | 0.15 | 0.015 | 0.015 | 0.006 |
| 625 | 58.0 | 20.0-23.0 | 5.0 | 8.0-10.0 | 3.15-4.15 | 1.0 | 0.5 | | 0.4 | 0.4 | 0.5 | 0.1 | 0.015 | 0.015 | |
| 718 | 50.0-55.0 | 17.0-21.0 | balance | 2.8-3.3 | 4.75-5.5 | 1.0 | 0.35 | 0.2-0.8 | 0.65-1.15 | 0.3 | 0.35 | 0.08 | 0.015 | 0.015 | 0.006 |
| X-750 | 70.0 | 14.0-17.0 | 5.0-9.0 | | 0.7-1.2 | 1.0 | 1.0 | 0.5 | 0.4-1.0 | 2.25-2.75 | 0.5 | 0.08 | 0.01 | | |

The fire-retardant material layer 16 and the thermally and electrically conductive coating material layer 14 cooperate to provide fire-resistance to the non-metallic aircraft component 10, i.e., the fire- and EMI-resistant aircraft component is rendered fire-resistant (i.e., able to pass the flame certification test), certifying the aircraft component for use. The fire-retardant material layer does not otherwise provide sufficient fire resistance (to pass the flame exposure test) to the non-metallic aircraft component without the thermally and electrically conductive coating material layer.

While manufacture of a fire- and EMI-resistant component has been described, it is to be understood that an EMI-resistant only component may be manufactured by omitting the thermally and electrically conductive coating material layer (not shown) and corresponding forming step 120. The EMI-resistant only component comprises the intermediate article 12 including the continuous electrically conductive element 26 and the fire-retardant layer 16 disposed directly on the intermediate article.

It is to be appreciated that fire- and EMI-resistant aircraft components with lightweight and effective integral fire- and EMI shielding materials and methods for manufacturing the same have been provided. Non-metallic aircraft components may be rendered fire- and EMI-resistant, certifying them for use. The sandwich coating system described herein provides lightweight and effective integral fire- and EMI shielding materials for non-metallic aircraft components, eliminating the need for separate fire and EMI shielding materials that add weight and take up space.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for manufacturing a fire- and electromagnetic interference (EMI)-resistant aircraft component, the method comprising the steps of:
   forming an intermediate article comprised of a non-metallic material;
   integrating a continuous electrically conductive element within a substrate of the non-metallic material during the forming of the intermediate article;
   forming a thermally and electrically conductive coating material layer on at least a portion of the intermediate article, the thermally and electrically conductive coating material layer comprising a metal; and
   cold spraying a fire-retardant material layer on the thermally and electrically conductive coating material layer, wherein the integrating the continuous electrically conductive element within the substrate of the non-metallic material during the forming of the intermediate article comprises:
    substantially simultaneously feeding a filament of the non-metallic material and the continuous electrically conductive element through a dual extrusion head of a fused deposition modeling system.

2. The method of claim 1, wherein the intermediate article comprises the non-metallic material selected from the group consisting of a polymeric material and a composite material.

3. The method of claim 1, wherein the continuous electrically conductive element comprises a metal selected from the group consisting of copper, aluminum, alloys thereof, brass, and combinations thereof.

4. The method of claim 1, wherein the step of forming a thermally and electrically conductive coating material layer comprises applying the thermally and electrically conductive coating material layer comprised of a metal selected from the group consisting of copper, aluminum, alloys thereof, brass, and combinations thereof.

5. The method of claim 1, wherein the step of cold spraying a fire retardant material layer comprises cold spraying a fire-retardant material selected from the group consisting of a nickel-based alloy or superalloy, a ferrous-based alloy, a cobalt-based alloy, and combinations thereof.

6. The method of claim 5, wherein the step of cold spraying a fire retardant material layer comprises cold spraying to a material thickness of about 100 µm to about 700 µm.

7. A method for manufacturing a fire- and EMI-resistant aircraft component comprising the steps of:
    forming an additive-manufactured intermediate article comprising a polymeric material;
    integrating a continuous electrically conductive filament within a substrate of the polymeric material during the forming of the additive-manufactured intermediate article such that the continuous electrically conductive filament extends from one end of the additive-manufactured intermediate article to another end of the additive-manufactured intermediate article;
    applying a thermally and electrically conductive coating material layer on the additive-manufactured article forming a coated article, the thermally and electrically conductive coating material layer comprising a metal; and
    cold spraying a fire retardant material layer on the coated article,
    wherein the integrating the continuous electrically conductive filament within the substrate of the polymeric material during the forming of the additive-manufactured intermediate article comprises:
        substantially simultaneously feeding a filament of the polymeric material and the continuous electrically conductive filament through a dual extrusion head of a fused deposition modeling system.

8. The method of claim 7, wherein the continuous electrically conductive filament comprises a metal selected from the group consisting of copper, aluminum, alloys thereof, brass, and combinations thereof.

9. The method of claim 7, wherein the step of applying a thermally and electrically conductive coating material layer comprises applying the metal selected from the group consisting of copper, aluminum, alloys thereof, brass, and combinations thereof.

10. The method of claim 7, wherein the step of cold spraying a fire retardant material layer comprises cold spraying a fire-retardant material selected from the group consisting of an nickel-based alloy or superalloy, a ferrous-based alloy, a cobalt-based alloy, and combinations thereof.

11. The method of claim 10, wherein the step of cold spraying a fire retardant material layer comprises cold spraying to a material thickness of about 100 µm to about 700 µm.

\* \* \* \* \*